United States Patent [19]
Foote et al.

[11] Patent Number: 5,847,388
[45] Date of Patent: Dec. 8, 1998

[54] COLLIMATOR FOR HIGH TAKEOFF ANGLE ENERGY DISPERSIVE SPECTROSCOPY (EDS) DETECTORS

[75] Inventors: Steven J. Foote, Middleton, Wis.; Minoru Shinohara, Hitachinaka, Japan

[73] Assignee: Noran Instruments, Inc., Middleton, Wis.

[21] Appl. No.: 872,945

[22] Filed: Jun. 11, 1997

[51] Int. Cl.⁶ .................................................. H01J 37/252
[52] U.S. Cl. ............................................................ 250/310
[58] Field of Search ............................................ 250/310

[56] References Cited

U.S. PATENT DOCUMENTS

| 4,633,085 | 12/1986 | Tomita et al. | 250/310 |
| 4,910,399 | 3/1990 | Taira et al. | 250/310 |
| 5,266,802 | 11/1993 | Kasai et al. | 250/310 |

OTHER PUBLICATIONS

C. E. Fiori & D.E. Newbury, Operation of Energy–Dispersive X–Ray Spectrometers in the Analytical Electron Microscope, Analytical Electron Microscopy, 1981.

W. A. P. Nicholson, et al., Optimizing thin film X–ray spectra for quantitative analysis, J. Microscopy, vol. 125, pt. 1, pp. 25–40, Jan. 1982.

D. B. Williams, Practical Electron Microscopy in Materials Science: Quantitative X–Ray Microanalysis in the Analytical Electron Microscope. . . Chapter 4, Norelco Reporter, vol. 29, No. 3, pp. 6–18, Dec. 1982.

Herbert Ruoff, et al., Compton Scattered X–Ray Lines in the EDS Spectrum of an Analytical 200 kV TEM, Beitr. elektronenmikroscope. Direktabb. Oberfl., 20, pp. 1–7, 1987.

*Primary Examiner*—Jack I. Berman
*Attorney, Agent, or Firm*—Foley & Lardner

[57] ABSTRACT

A two-piece collimator for use in high takeoff angle energy dispersive spectroscopy (EDS) is provided. The two-piece collimator includes a base section and an extension section. The collimator base section may be attached rigidly to the end of an EDS detector tube. The collimator extension section is removably attached to and extends from the base section. Apertures through the base and extension sections are easily aligned with each other and with an EDS detector. The length of the collimator extension section is preferably selected such that the distal end of the extension section extends below the bottom of an upper pole piece of an electron microscope in which the collimator is employed. A two-piece collimator in accordance with the present invention effectively reduces stray radiation, including back scattered electrons, which may cause artifacts in a detected EDS X-ray spectrum. Alternatively, a collimator in accordance with the present invention may be used in combination with an existing pole piece insert collimation device by removing the extension section from the two-piece collimator.

28 Claims, 4 Drawing Sheets

COLLIMATOR FOR HIGH TAKEOFF ANGLE ENERGY DISPERSIVE SPECTROSCOPY (EDS) DETECTORS

FIELD OF THE INVENTION

This invention pertains generally to electron microscope systems used for energy dispersive spectroscopy (EDS), and more particularly to collimators for limiting the amount of stray radiation detected by EDS detectors.

BACKGROUND OF THE INVENTION

Energy dispersive spectroscopy (EDS) is a microanalytical technique based on the characteristic X-ray spectrum peaks that are generated when the high energy beam of an electron microscope interacts with a specimen. When high voltage electrons traverse a specimen, one of the primary inelastic interactions is that of inner-shell ionization. The ejection of an electron from the inner shell of an atom leaves the atom in an excited state. One of the ways that the atom can return to the ground state is by an electron from an outer shell of the atom falling to the vacant inner-shell position. At the same time, an X-ray of characteristic energy and, therefore, wavelength is emitted. This characteristic energy and wavelength is a function of the difference in electron energy levels of the atom. Therefore, each element in a specimen produces an X-ray emission having a characteristic spectral fingerprint that may be used to identify the presence of that element within the specimen.

In EDS, the X-rays which are produced when high voltage electrons from an electron beam impact a specimen are detected by a solid-state silicon-lithium EDS detector. The construction and efficiency of this detector sets a lower limit on the atomic number that may be detected. Generally, elements heavier than carbon are detectable.

X-rays contacting the EDS detector cause signals relative to the energy level, or wavelength, of the X-ray to be produced. The number of signals produced at each energy level are counted to generate an X-ray spectrum. The X-ray spectrum may be displayed as a spectrum of X-ray intensity versus X-ray energy. Relative concentrations of elements in the specimen may be determined from the relative height of the intensity peaks in the spectrum display.

When X-rays are generated in a sample specimen by an electron beam, they must pass through some portion of the sample specimen on their way off to the EDS detector. Minimizing the path length through the sample material will minimize the amount of absorption of the emitted X-rays and provide more counts per second into the detector at a given electron beam current. The path length through the material will be minimized if the detector is positioned at as high an angle above the sample horizontal as possible. The angle above the sample horizontal at which the detector is positioned is known as the "detector takeoff angle" (TOA).

It is the designer's goal to maximize the TOA as much as the geometry of the electron microscope will permit. Unfortunately, there are some cases wherein the implementation of a high TOA can only be accomplished at the cost of reduced ease of adjustment of the detector, increased expense, or even degraded performance of the detector. For example, two important systems which are used for EDS are transmission electron microscopes (TEM) and high resolution scanning electron microscopes (HRSEM). Each of these systems use TEM pole pieces. In both cases, the shape of the objective lens pole piece restricts the position the EDS detector can occupy.

Figure 1:
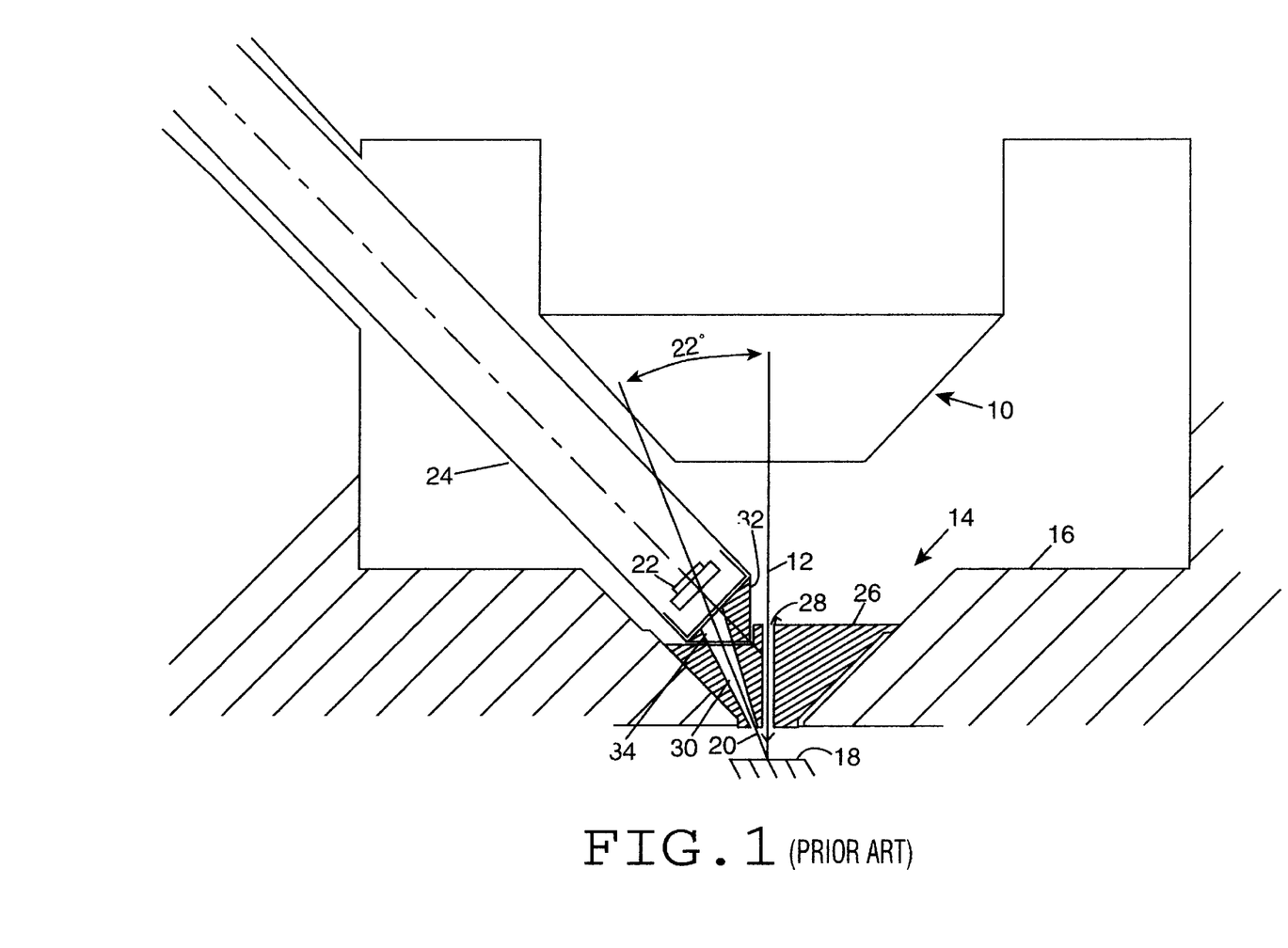
FIG. 1 is a schematic illustration of an electron microscope configured to perform energy dispersive spectroscopy (EDS) and having a conventional pole piece insert positioned on the upper pole piece of the microscope to provide collimation to reduce the amount of stray radiation detected by an EDS detector.

A schematic illustration of a TEM 10 configured to perform EDS is presented in FIG. 1. The TEM 10 produces an electron beam 12 which is directed through an aperture 14 in an upper objective pole piece 16 to impact the specimen 18 (which is placed on a sample specimen holder). X-rays generated in the specimen 18 by the electron beam 12 travel back along a path 20 through the aperture 14 in the pole piece 16 to impact the EDS detector 22. The EDS detector 22 is mounted in an EDS detector tube 24. The EDS detector tube 24 is mounted to provide the maximum TOA. However, as illustrated in FIG. 1, the shape of the pole piece 16 and the other components of the TEM 10 restrict the position that the detector 22 can occupy.

The shape of the pole piece 16 also limits the amount of shielding, or collimation, that can be placed around the detector 22. Collimators are used to limit the field of view of the detector 22, thereby limiting the amount of stray radiation that the detector 22 will see from the region of the specimen 18. Stray radiation can be detected as artifacts in the spectrum of X-rays emitted from the specimen 18, thereby affecting the accuracy of sample specimen measurements and analysis.

Although stray radiation can arise from many sources, stray radiation arising from electrons that are backscattered by the specimen 18, or by a lower pole piece positioned below the specimen 18 in a TEM, pose a particular problem. Backscattered electrons (BSE) deposit large amounts of energy in the detector 22, causing long duration dead times during data acquisition, generating artifacts in the detected spectrum of X-rays emitted from the specimen 18, degrading peak resolution, and possibly even damaging the detector 22.

The manufacturers of electron microscopes are aware of the problems caused by stray radiation impacting the EDS detector. Many manufacturers provide "X-ray kits" which are inserted in the microscope to provide at least partial collimation to reduce some of these problems. These kits often include revised spray apertures for the condenser lens system (located above the EDS detector), an insert for the upper objective pole piece that acts as the primary X-ray and electron collimator, and caps for the lower pole piece which are made from a low atomic number material to minimize backscattered electrons.

An example of a conventional pole piece insert which is used to reduce the amount of stray radiation impacting the EDS detector 22 is illustrated schematically at 26 in FIG. 1. A pole piece insert 26 typically consists of a light element material (e.g., carbon) machined to fit in place in the aperture 14 through the pole piece 16. The pole piece insert 26 includes a central aperture 28 through which the electron beam 12 passes, and a tapered aperture 30 that provides a view of the sample 18 to the EDS detector 22. The tapered X-ray aperture 30 through the pole piece insert 26 must be carefully aligned with the EDS detector 22 in order to provide the maximum benefit. If the aperture 30 and the EDS detector 22 are not properly aligned, the quantity of desirable emitted X-rays from the specimen 18 which contact the EDS detector 22 will be reduced.

There are numerous disadvantages to the use of a pole piece insert as a collimator. Pole piece inserts are typically very expensive, ranging in price from several thousand dollars, when ordered with the microscope, to several tens of thousands of dollars, if the microscope must be fitted for EDS in the field. The pole piece insert, and the rest of the X-ray kit, is difficult to manufacture. The pole piece insert is often very difficult to align with the EDS detector in the field. Moreover, while pole piece inserts are effective X-ray collimators, reducing the number of stray X-rays reaching the EDS detector, improperly designed pole piece inserts do little to impede backscattered electrons. A pole piece insert may, in fact, contribute to the BSE problem by scattering electrons in the direction of the EDS detector.

The performance of a pole piece insert may be improved if the pole piece insert 26 is used in combination with a short collimator 32 attached to the end of the EDS detector tube 24. The short collimator 32 includes a tapered aperture 34 which must be aligned with the tapered X-ray aperture 30 in the pole piece insert 26. This increases the alignment difficulty problem discussed previously. A significant problem in the field has always been how to verify that the pole piece insert 26 is aligned with the EDS collimator 32, and how to ensure that they both look at the proper area of the sample specimen 18.

Figure 2:
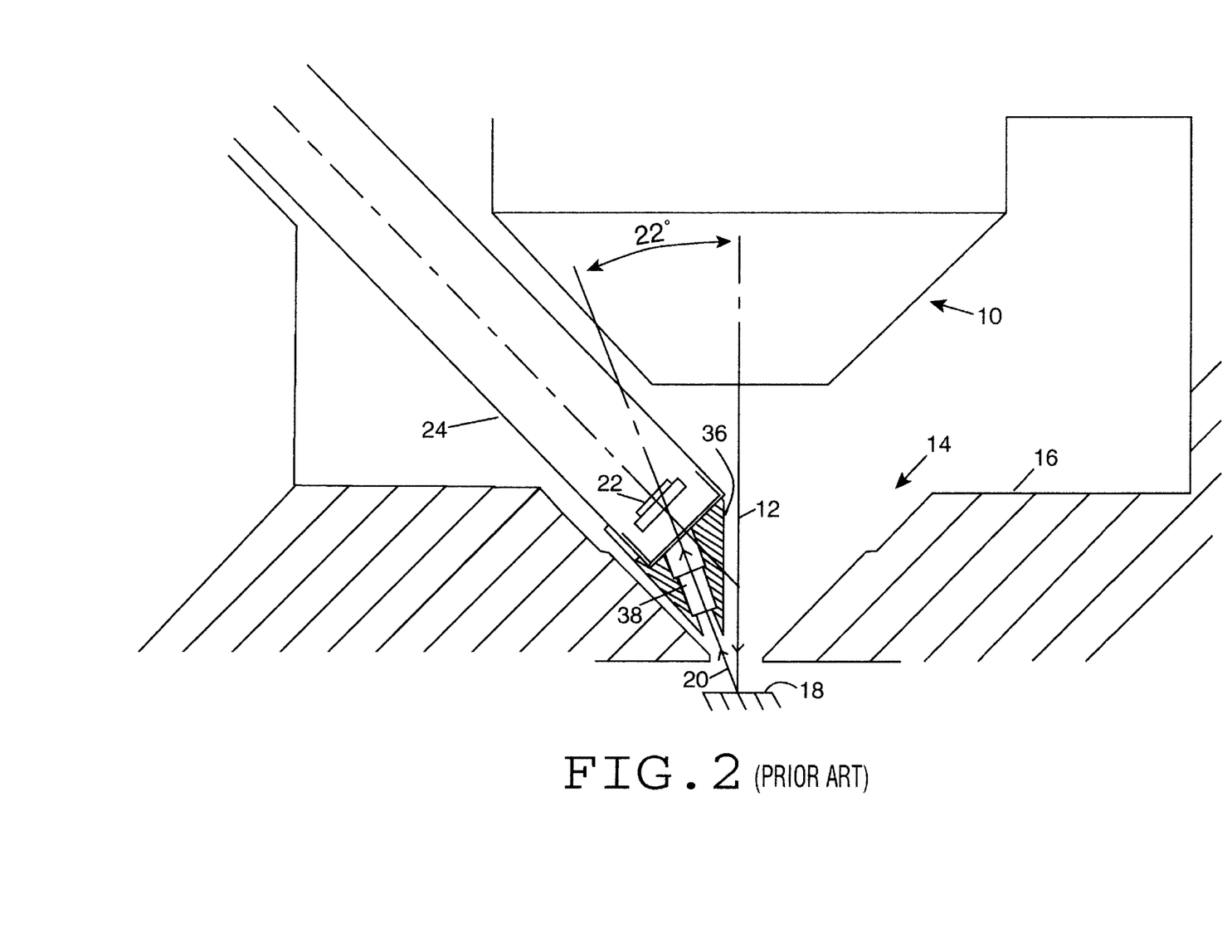
FIG. 2 is a schematic illustration of an electron microscope configured to perform EDS and having a conventional single piece collimator attached to the end of the EDS detector tube to provide collimation to reduce the amount of stray radiation detected by the EDS detector.

An alternative method for collimation in EDS is illustrated schematically in FIG. 2. (Note that structures illustrated in FIG. 2 which are identical to structures illustrated in and described with reference to FIG. 1 are labeled with the same reference numerals as are used in FIG. 1.) In this case, a pole piece insert has not been supplied by the microscope manufacturer. A long single piece collimator 36, which may typically be supplied by the manufacturer of the EDS detector 22, is attached to the end of the EDS detector tube 24. The collimator 36 extends into the aperture 14 in the pole piece 16. An aperture 38 through the collimator 36 allows the X-rays 20 emitted from the sample specimen 18 to reach the EDS detector 22. Undesirable stray radiation reaching the EDS detector 22 is reduced by the collimator 36. However, significant amounts of undesirable stray radiation, including backscattered electrons, may still reach the EDS detector 22, affecting EDS accuracy, and resulting in the other problems discussed previously.

SUMMARY OF THE INVENTION

In accordance with the present invention, a two-piece collimator for high takeoff angle energy dispersive spectroscopy (EDS) detectors is provided. A two-piece collimator in accordance with the present invention includes a base section and an extension section. The collimator base section is adapted to be attached rigidly to the end of an EDS detector tube. The base section includes an aperture through which X-rays emitted from a sample specimen may pass. The extension section of the two-piece collimator is removably attached to, and extends from, the collimator base section. A base end of the extension section may be supported within the aperture of the base section. The collimator extension section includes an aperture which is aligned with the base section aperture. Thus, X-rays emitted from a sample specimen pass through the apertures of both the extension and base sections of the collimator on their way to the EDS detector.

The length of the collimator extension section is preferably selected such that the distal end of the extension section extends below the bottom of the upper pole piece of the electron microscope which is being used to perform EDS. This will significantly reduce the number of back scattered electrons (BSE) that can enter the collimator and scatter into the EDS detector.

The collimator extension section may be removed from the base section. The collimator base section, which is attached to the end of the EDS detector tube, may then be used, without the extension section, in combination with an existing pole piece insert.

A two-piece collimator in accordance with the present invention reduces or eliminates many of the difficulties and problems associated with prior art EDS collimation devices. In comparison with conventional pole piece inserts, the collimator of the present invention is significantly less expensive. Moreover, the collimator of the present invention is easily installed as part of the normal process of installing an EDS detector on an electron microscope. Alignment of the collimator with the EDS detector is automatic, since the two pieces of the collimator are assembled and attached rigidly to the end of the EDS detector tube. Alignment of the collimator to the intersection point of the electron beam and the sample specimen is much simplified, and can be performed with the adjustments normally used to align the EDS detector with a pole piece insert. The two-piece design of the collimator of the present invention allows use of the collimator alone, with the extension section attached, or in combination with an existing pole piece insert, with the extension section removed. With the extension section of the collimator attached, the collimator of the present invention is much more effective than a conventional pole piece insert at reducing the amount of BSE artifacts present in a detected EDS X-ray spectrum.

A two-piece collimator in accordance with the present invention may be fabricated using conventional collimator fabrication techniques from materials which are conventionally used to make collimators for EDS systems. The collimator base section and the collimator extension section may be made from the same or different materials. For example, the base section may be made from carbon coated aluminum, with the extension section made from carbon coated tungsten. The two-piece design of the collimator facilitates fabrication thereof from different materials.

Further objects, features, and advantages of the present invention will be apparent from the following detailed description taken in conjunction with the accompanying drawings.

DETAILED DESCRIPTION OF THE INVENTION

Figure 3:
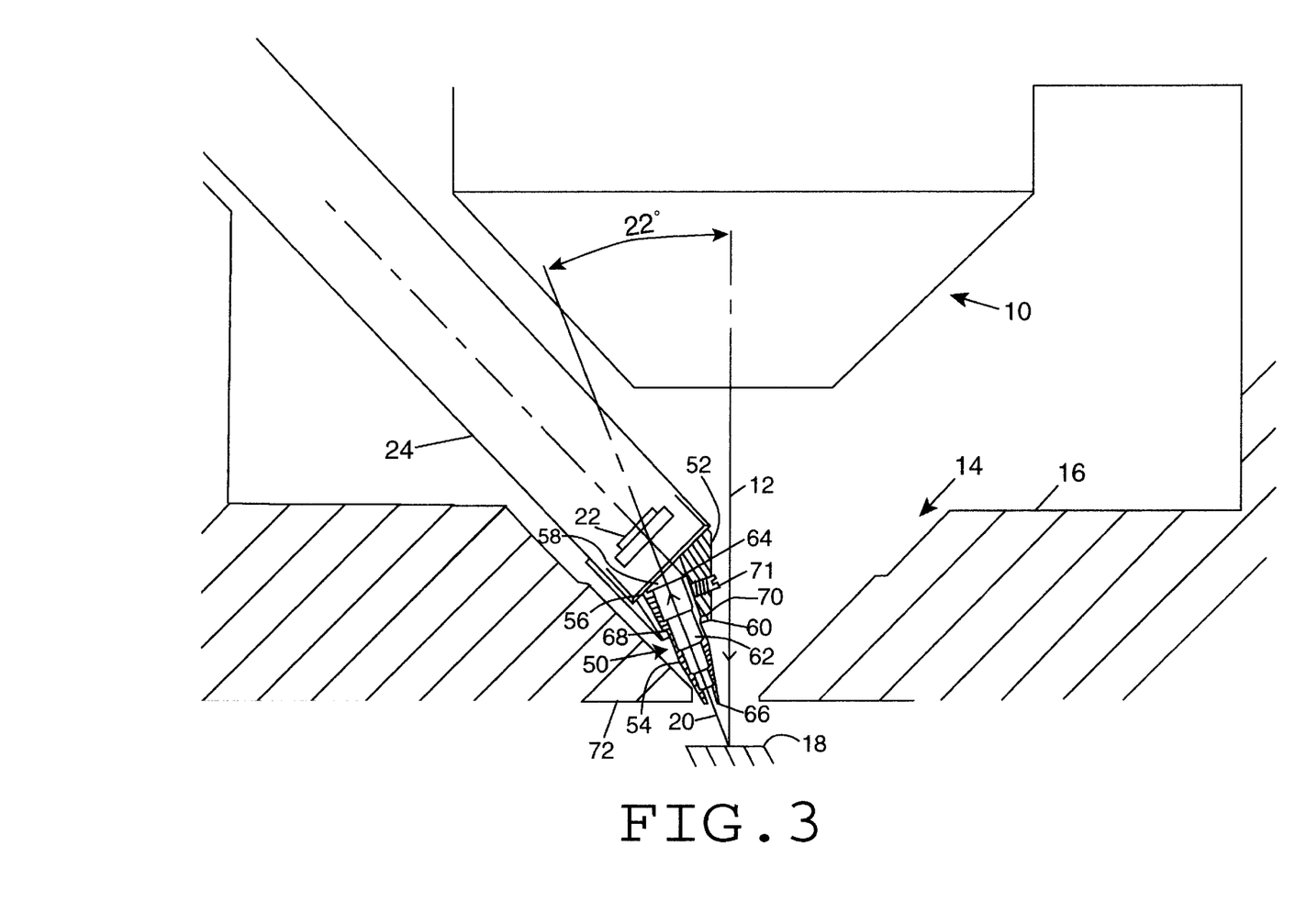
FIG. 3 is a schematic illustration of an electron microscope configured to perform EDS and having a two-piece collimator in accordance with the present invention attached to the EDS detector tube to provide improved collimation and significantly reduce the amount of stray radiation detected by the EDS detector.

A two-piece collimator 50 in accordance with the present invention is illustrated in and will be described with reference to FIG. 3. The collimator 50 is illustrated schematically in cross section, and mounted in an electron microscope system 10 configured to perform energy dispersive spectroscopy (EDS). The components, features, and operation of an electron microscope 10 configured to perform EDS were described in general previously with respect to FIG. 1. Further details will be known to those having skill in the art of EDS. Components of the electron microscope 10 illustrated in FIG. 3 which are identical to those described previously with respect to FIG. 1 are identified by the same reference numerals as are used in FIG. 1.

A collimator 50 in accordance with the present invention features two sections, a base section 52 and an extension section 54. The collimator base section 52 includes a base end 56 which is adapted to be attached rigidly to the end of an EDS detector tube 24. The base end 56 of the collimator base section 52 may be rigidly attached to the end of the EDS detector tube 24 in any conventional manner. Preferably, the cylindrical base end 56 may be machined to form a spring clamp structure therein which engages the end of the EDS detector tube 24.

The collimator base section 52 includes a base section aperture 58 which extends from the base end 56 of the collimator base section 52 to a distal end 60 of the collimator base section 52. The base section aperture 58 is formed in the collimator base section 52 such that when the base section 52 is attached rigidly to the end of the EDS detector tube 24 the base section aperture 58 is aligned with the EDS detector 22 such that X-rays 20 emitted from a sample specimen 18 will pass through the base section aperture 58 to the EDS detector 22.

The collimator extension section 54 is removably attached to, and extends from, the distal end 60 of the collimator base section 52. The collimator extension section 54 includes an extension section aperture 62 which extends from a base end 64 to a distal end 66 of the extension section 54. As illustrated in FIG. 3, the extension section aperture 62 is preferably narrower at the distal end 66 of the extension section 54 than at the base end 64 of the extension section 54. This may be achieved by either a step-wise (as illustrated) or continuous narrowing of the extension section aperture 62 from the base end 64 to the distal end 66 of the extension section 54.

The extension section aperture 62 is formed in the collimator extension section 54 such that when the extension section 54 is attached to the collimator base section 52 the extension section aperture 62 is automatically aligned with the base section aperture 58. Thus, when the two-piece collimator 50 is rigidly attached to the end of the EDS detector tube 24, the base section aperture 58 and the extension section aperture 62 are aligned with each other and with the EDS detector 22 such that X-rays 20 emitted from the sample specimen 18 may pass through the aligned apertures 58 and 62 to the EDS detector 22.

The collimator extension section 54 may be removably attached to the collimator base section 52 in various ways. Preferably, a flange 68 may be formed at the distal end 60 of the collimator base section 52 extending inward toward the axis of the base section aperture 58. The collimator extension section 54 may be made wider 70 near the base end 64 thereof than at the distal end 66 thereof. The collimator extension section 54 may then be removably attached to the collimator base section 52 by mounting the extension section 54 within the base section aperture 58. As illustrated in FIG. 3, the distal end 66 of the collimator extension section 54 protrudes from the distal end 60 of the collimator base section 52. The base end 64 of the extension section 54 resides in the base section aperture 58. When the collimator base section 52 is attached rigidly to the end of the EDS detector tube 24 the wide portion 70 near the base end 64 of the collimator extension section 54 engages the flange 68 at the distal end 60 of the base section 52. A set screw 71 extending through the side of the collimator base section 52 may be tightened down against a flattened portion of the base end 64 of the extension section 54 to hold the extension section in position. The base section aperture 58, flange 68, and base end 64 of the extension section 54 are preferably machined such that when the extension section 54 is mounted in the base section 52 the base section aperture 58 and extension section aperture 62 are automatically aligned with each other. Thus, when the collimator base section 52 is attached rigidly to the EDS detector tube 24, the extension section 54 is held rigidly in position with respect to the collimator base section 52 and the EDS detector tube 24 by the flange 68 and the set screw 71, and the collimator apertures 58 and 62 are aligned with each other and with the EDS detector 22.

The two-piece collimator 50 of the present invention is particularly adapted for use in high takeoff angle EDS detection systems. In operation, the collimator 50, attached to the EDS detector tube 24, is extended down into the aperture 14 in the upper pole piece 16. Preferably, the length of the collimator extension section 54 is selected such that the distal end 66 of the extension section 54 extends below the bottom 72 of the upper pole piece 16. The collimator 50 is preferably positioned such that the distal end of the collimator extension section extends at least 0.1 mm below the bottom 72 of the upper pole piece 16. As will be discussed in more detail below, when the collimator 50 is extended below the bottom 72 of the upper pole piece 16, the number of back scattered electrons (BSE) affecting the EDS detector 22 is greatly reduced.

A two-piece collimator 50 in accordance with the present invention is much more effective at reducing the amount of stray radiation affecting the EDS detector 22 than previously known collimators and pole piece inserts. The benefits of improved performance are accomplished in two ways.

First, the two-piece collimator 50 of the present invention is longer, and thus has a smaller field of view of the sample specimen 18 and its surrounding area, than previous collimators (e.g., the collimator illustrated in FIG. 2). Therefore, a two-piece collimator in accordance with the present invention is less likely to allow a spurious X-ray generated away from the sample 18 to be seen by the EDS detector 22.

Secondly, and not at all obvious, extending the longer collimator below the bottom 72 of the upper pole piece 16 has a major impact on reducing the number of BSE that can enter the collimator and scatter into the EDS detector 22. A possible reason for this improved BSE performance is as follows. During operation of the electron microscope 10 to perform EDS the sample specimen 18 is immersed in the very strong axial magnetic field of the objective lens of the microscope 10. When a BSE is generated at the sample 18 the magnetic field causes the BSE to spiral upward close to the vertical axis of the electron beam 12. If the magnetic field were uniformly strong up into the objective lens the BSE would never enter the collimator, but would continue to spiral close to the lens axis. However, near the upper pole piece 16, the magnetic field lines bend outward toward the metal pole piece 16. As the magnetic field loses strength the field lines are no longer vertical, but point in the direction of the collimator. Very close to the pole piece 16, therefore, the BSE move more horizontally, and thus can scatter off the surrounding material up into a collimator which is recessed in the pole piece aperture 14. However, in accordance with the present invention, the distal end 66 of the collimator 50 is preferably positioned to be lower than the bottom 72 of the pole piece 16, and therefore lower than the horizontally travelling BSE electrons. Thus, positioning a collimator in accordance with the present invention blocks BSEs from entering the collimator 50. Note also that the distance between the distal end 66 of the collimator and the center of the electron beam 12 will also be a critical dimension in regard to the radius of the spiral of the BSE emitted from the sample 18.

Figure 4:
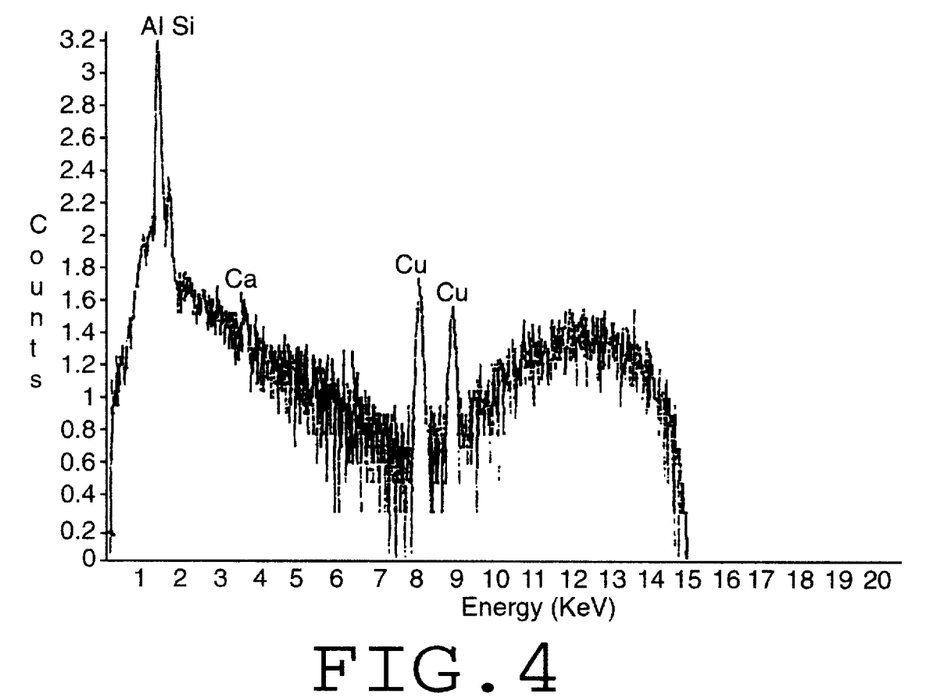
FIG. 4 is an EDS X-ray spectrum from a thick foil of pure copper obtained using the collimator of FIG. 2.
Figure 5:
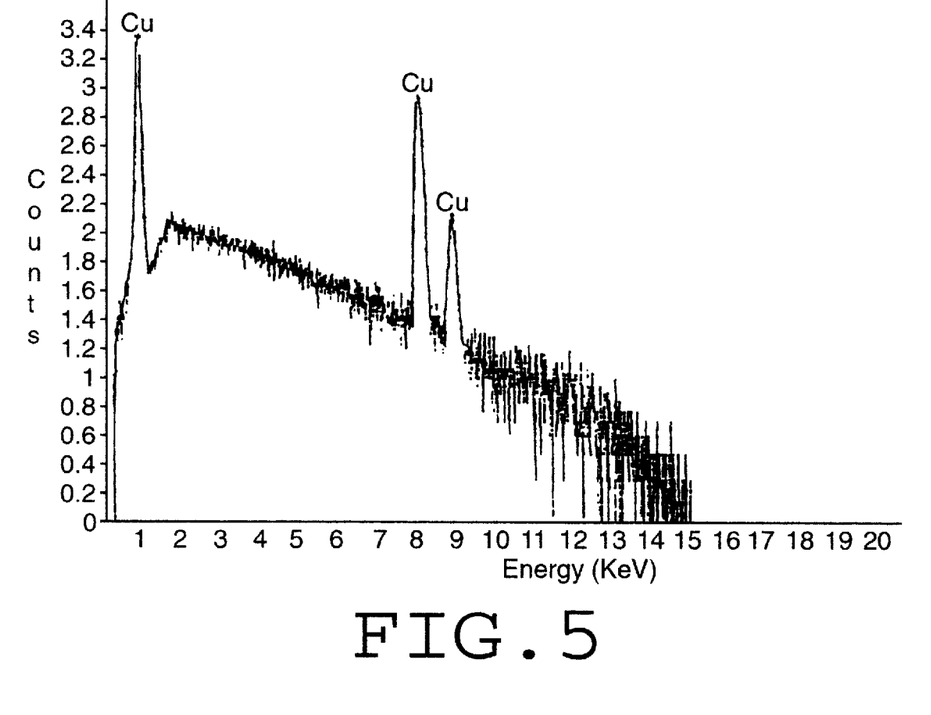
FIG. 5 is an EDS X-ray spectrum from a thick foil of pure copper obtained under the same excitation conditions as were used to obtain the X-ray spectrum of FIG. 4 but using a two-piece collimator in accordance with the present invention.

The improved effectiveness of a two-piece collimator 50 in accordance with the present invention is made apparent by a comparison of the X-ray spectra illustrated in FIGS. 4 and 5. FIG. 4 illustrates an X-ray spectrum obtained from EDS of a thick foil of pure copper excited by an electron beam of 15 kV electrons. In this case, a collimator 36 of the type illustrated in FIG. 2 was used. The vertical scale of FIG. 4 is a log scale. As can be seen, the X-ray spectrum of FIG. 4 is distorted above 9 keV, by a large hump generated by back scattered electrons, and spurious X-ray peaks from Al, Si, and Ca are present. These elements are not in the pure copper sample, but come from surrounding material in the specimen chamber and holder.

The X-ray spectrum illustrated in FIG. 5 was obtained from the same sample and using the same excitation conditions as were used to obtain the X-ray spectrum of FIG. 4. However, for the X-ray spectrum of FIG. 5, a two-piece collimator 50 in accordance with the present invention was employed. As can be seen, with the collimator of the present invention in place, only X-ray peaks from the copper sample are seen in the X-ray spectrum, and the prominent hump above 9 keV due to backscattered electrons entering the detector 22 is no longer present.

As has just been discussed, a two-piece collimator 50 in accordance with the present invention provides improved EDS performance in comparison with previously known collimators and pole piece insert collimation devices. This is particularly true in the case of BSE performance, in that improperly designed pole piece inserts do little to impede BSE and may, in fact, contribute to the problem by scattering electrons in the direction of the EDS detector 22. However, in some cases, a pole piece insert 26 may already be in place in the microscope 10. In such a case, the collimator extension section 54 of the two-piece collimator 50 may be removed from the collimator base section 52. With the collimator base section 52 alone attached to the EDS detector tube 24 a shorter collimator is provided which may be used in combination with the existing pole piece insert. The resulting collimation structure will be similar to that illustrated in FIG. 1, with the collimator base section 52 of the two-piece collimator 50 performing the function of the short collimator 32 illustrated in FIG. 1.

From the foregoing detailed description, it is apparent that a collimator in accordance with the present invention provides several advantages over previously known collimators and pole piece inserts. A two-piece collimator in accordance with the present invention is very simple to make and install, and yet is very effective in reducing the number of back scattered electrons reaching the EDS detector. A two-piece collimator in accordance with the present invention may be installed as part of the normal EDS installation process. Alignment of the two-piece collimator 50 with the EDS detector 22 is automatic since the two pieces of the collimator 50 are assembled and attached rigidly to the end of the EDS detector tube 24. Alignment of the collimator 50 to the intersection point of the electron beam 12 and the sample specimen 18 is much simplified, and can be performed with the adjustments normally used to align the EDS detector with a pole piece insert. As discussed previously, the two-piece design of a collimator 50 in accordance with the present invention allows one to completely, and more effectively, replace conventional pole piece inserts, using both sections of the two-piece collimator 50, or to use the base section of the two-piece collimator alone, in combination with an existing pole piece insert. As described and illustrated previously, a collimator 50 in accordance with the present invention is much more effective than previously known collimators at reducing BSE artifacts present in an EDS X-ray spectrum.

A two-piece collimator in accordance with the present invention may be fabricated using fabrication techniques which are conventionally used to fabricate collimators and pole piece inserts. A two-piece collimator in accordance with the present invention may be made of various materials conventionally used for the fabrication of EDS collimators. Such materials include carbon coated aluminum, and carbon coated tungsten. Also, different materials may be used to fabricate the collimator base section and extension section. For example, the collimator base section may be made from carbon coated aluminum, with the collimator extension section made of carbon coated tungsten. The two-piece design of the collimator facilitates fabrication thereof from different materials.

It should be understood that a two-piece collimator in accordance with the present invention may be employed in combination with any electron microscope system configured for performing EDS. Thus, a two-piece collimator in accordance with the present invention may be employed in combination with any analytical electron microscope (AEM) system, including transmission electron microscopes (TEM) and high resolution scanning electron microscopes (HRSEM). Although the two-piece collimator of the present invention is particularly effective in high detector takeoff angle applications, it is understood that the present invention is not limited to such applications. It should also be understood that this invention is not confined to the particular embodiments, implementations, and applications herein illustrated and described, but embraces all such modified forms thereof as come within the scope of the following claims.

What is claimed is:

1. A collimator for energy dispersive spectroscopy (EDS) detectors, comprising:

(a) a collimator base section having a base end adapted to be attached rigidly to an EDS detector tube, a distal end, and a base section aperture extending from the base end of the collimator base section to the distal end of the collimator base section; and (b) a collimator extension section having a base end which is removably attachable at the distal end of the of the collimator base section, a distal end which extends from the distal end of the collimator base section when the collimator extension section is attached to the collimator base section, and an extension section aperture extending from the base end of the collimator extension section to from the distal end of the collimator extension section such that the extension section aperture and the base section aperture are aligned when the collimator extension section is attached to the collimator base section.

2. The collimator of claim 1 wherein the collimator base section and the collimator extension section comprise materials selected from the group of materials consisting of carbon coated aluminum and carbon coated tungsten.

3. The collimator of claim 1 wherein the collimator base section is made of carbon coated aluminum and the collimator extension section is made of carbon coated tungsten.

4. The collimator of claim 1 wherein the extension section aperture is tapered such that the extension section aperture is wider at the base end of the collimator extension section than at the distal end of the collimator extension section.

5. The collimator of claim 4 wherein the extension section aperture is tapered in a step-wise manner.

6. The collimator of claim 1 wherein the collimator extension section has a length which is selected such that when the collimator is placed in an EDS detector system the distal end of the collimator extension section extends through an aperture in an upper pole piece to below a bottom of the pole piece.

7. The collimator of claim 7 wherein the collimator extension section has a length which is selected such that when the collimator is placed in an EDS detector system the distal end of the collimator extension section extends through an aperture in an upper pole piece to at least 0.1 millimeters below a bottom of the pole piece.

8. A collimator for energy dispersive spectroscopy (EDS) detectors, comprising:
    (a) a collimator base section having a base end adapted to be attached rigidly to an EDS detector tube, a distal end, a base section aperture extending from the base end of the collimator base section to the distal end of the collimator base section, and a flange formed on the distal end of the collimator base section which extends inward toward the axis of the base section aperture; and
    (b) a collimator extension section having a base end, a distal end which is narrower than the base end of the collimator extension section such that the collimator extension section is attachable to the collimator base section by extending the distal end of the collimator extension section through the base section aperture at the distal end of the collimator base section such that the base end of the collimator extension section is within the base section aperture and the collimator extension section is held in the collimator base section by the flange, and an extension section aperture extending from the base end of the collimator extension section to the distal end of the collimator extension section such that the extension section aperture and the base section aperture are aligned when the collimator extension section is attached to the collimator base section.

9. The collimator of claim 8 comprising additionally a set screw extending through a side of the collimator base section and adapted to be tightened down against the collimator extension section to hold the collimator extension section in place.

10. The collimator of claim 8 wherein the collimator base section and the collimator extension section comprise materials selected from the group of materials consisting of carbon coated aluminum and carbon coated tungsten.

11. The collimator of claim 10 wherein the collimator base section is made of carbon coated aluminum and the collimator extension section is made of carbon coated tungsten.

12. The collimator of claim 8 wherein the extension section aperture is tapered such that the extension section aperture is wider at the base end of the collimator extension section than at the distal end of the collimator extension section.

13. The collimator of claim 12 wherein the extension section aperture is tapered in a step-wise manner.

14. The collimator of claim 8 wherein the collimator extension section has a length which is selected such that when the collimator is placed in an EDS detector system the distal end of the collimator extension section extends through an aperture in an upper pole piece to below a bottom of the pole piece.

15. The collimator of claim 14 wherein the collimator extension section has a length which is selected such that when the collimator is placed in an EDS detector system the distal end of the collimator extension section extends through an aperture in an upper pole piece to at least 0.1 millimeters below a bottom of the pole piece.

16. An improved electron microscope system for performing energy dispersive spectroscopy including an electron beam source, an upper pole piece having an aperture therein through which the electron beam may pass, a sample specimen holder area located below the aperture in the upper pole piece, an EDS detector tube, and an EDS detector mounted in the EDS detector tube, the improvement comprising:
    a collimator attached rigidly to the EDS detector tube, including
        (a) a collimator base section having a base end attached rigidly to the EDS detector tube, a distal end, and a base section aperture extending from the base end of the collimator base section to the distal end of the collimator base section; and
        (b) a collimator extension section having a base end which is removably attachable at the distal end of the of the collimator base section, a distal end which extends from the distal end of the collimator base section when the collimator extension section is attached to the collimator base section, and an extension section aperture extending from the base end of the collimator extension section to the distal end of the collimator extension section such that the extension section aperture and the base section aperture are aligned with the EDS detector when the collimator extension section is attached to the collimator base section.

17. The system of claim 16 wherein the collimator base section and the collimator extension section comprise materials selected from the group of materials consisting of carbon coated aluminum and carbon coated tungsten.

18. The system of claim 16 wherein the collimator base section is made of carbon coated aluminum and the collimator extension section is made of carbon coated tungsten.

19. The system of claim 16 wherein the extension section aperture is tapered such that the extension section aperture is wider at the base end of the collimator extension section than at the distal end of the collimator extension section.

20. The system of claim 19 wherein the extension section aperture is tapered in a step-wise manner.

21. The system of claim 16 wherein the distal end of the collimator extension section extends through the aperture in the upper pole piece to below a bottom of the pole piece.

22. The system of claim 21 wherein the distal end of the collimator extension section extends through the aperture in the upper pole piece to at least 0.1 millimeters below the bottom of the pole piece.

23. The system of claim 16 wherein the collimator base section includes a flange formed on the distal end thereof which extends inward toward the axis of the base section aperture, wherein the base end of the collimator extension section is wider than the distal end of the collimator extension section, and wherein the collimator extension section is attachable to the collimator base section by extending the distal end of the collimator extension section through the base section aperture at the distal end of the collimator base section such that the base end of the collimator extension section is within the base section aperture and the collimator extension section is held in the collimator base section by the flange.

24. An improved electron microscope system for performing energy dispersive spectroscopy including an electron beam source, an upper pole piece having an aperture therein through which the electron beam may pass, a sample specimen holder area located below the aperture in the upper pole piece, an EDS detector tube, and an EDS detector mounted in the EDS detector tube, the improvement comprising:

a collimator having a base end attached rigidly to the EDS detector tube, a distal end extending through the aperture in the upper pole piece to below a bottom of the pole piece, and a collimator aperture extending from the base end of the collimator to the distal end of the collimator such that the collimator aperture is aligned with the EDS detector.

25. The system of claim 24 wherein the collimator comprises a material selected from the group of materials consisting of carbon coated aluminum and carbon coated tungsten.

26. The system of claim 24 wherein the collimator aperture is tapered such that the collimator aperture is wider at the base end than at the distal end.

27. The system of claim 26 wherein the collimator aperture is tapered in a step-wise manner.

28. The system of claim 24 wherein the distal end of the collimator extends through the aperture in the upper pole piece to at least 0.1 millimeters below the bottom of the pole piece.

* * * * *